United States Patent
Mei et al.

(10) Patent No.: US 8,472,647 B2
(45) Date of Patent: Jun. 25, 2013

(54) PACKAGE FOR MICRO-ELECTRO-MECHANICAL ACOUSTIC TRANSDUCER WITH IMPROVED DOUBLE SIDE MOUNTABLE ELECTRODES

(75) Inventors: Jia-Xin Mei, Suzhou Industrial Park (CN); Gang Li, Suzhou Industrial Park (CN)

(73) Assignee: Memsensing Microsystems Co., Ltd., Suzhou (CN)

( * ) Notice: Subject to any disclaimer, the term of this patent is extended or adjusted under 35 U.S.C. 154(b) by 410 days.

(21) Appl. No.: 12/416,186

(22) Filed: Apr. 1, 2009

(65) Prior Publication Data

US 2009/0257614 A1    Oct. 15, 2009

(30) Foreign Application Priority Data

Apr. 10, 2008 (CN) .......................... 2008 1 0035916

(51) Int. Cl.
*H04R 25/00* (2006.01)
*H01L 29/84* (2006.01)

(52) U.S. Cl.
USPC .................... 381/175; 257/416; 257/E29.324

(58) Field of Classification Search
USPC ........... 381/91, 170–181, 189, 191, 360–365; 257/252, 254, 414–420, E29.001, E29.166, 257/E29.324
See application file for complete search history.

(56) References Cited

U.S. PATENT DOCUMENTS

2007/0013036 A1 *  1/2007 Zhe et al. ...................... 257/659

* cited by examiner

*Primary Examiner* — Ha Tran T Nguyen
*Assistant Examiner* — Kevin Quinto
(74) *Attorney, Agent, or Firm* — Ming Chow; Sinorica, LLC (57) ABSTRACT

A surface mountable package includes a base and a cover with a cavity defined thereby, and an acoustic transducer unit received in the cavity. The cover includes a first metal ring to enclose the acoustic transducer unit. The base includes a second metal ring to press against the first metal ring in order to form a metal shielding area. First and second metal connecting paths are formed electrically connected to the metal shielding area and the acoustic transducer unit, respectively. Besides, two pairs of first and second surface mountable metal electrodes are electrically connected to the first and the second metal connecting paths, respectively. As a result, the package can be selectively double surface mountable to a user's circuit board via the metal electrodes of the base or the metal electrodes of the cover.

20 Claims, 9 Drawing Sheets

PACKAGE FOR MICRO-ELECTRO-MECHANICAL ACOUSTIC TRANSDUCER WITH IMPROVED DOUBLE SIDE MOUNTABLE ELECTRODES

BACKGROUND OF THE INVENTION

1. Field of the Invention

The present invention relates to a package for micro-electro-mechanical acoustic transducer with surface mountable electrodes. More particularly, the present invention relates to a package with selectively double side mountable electrodes for being mounted to a user's circuit board.

2. Description of Related Art micro-electro-mechanical acoustic transducers are becoming more and more popular because of its low profile, excellent characteristics with multiple functions and easy to be integrated with integrated circuits. Silicon condenser microphone is one of the types of the micro-electro-mechanical acoustic transducer microphones. This kind of microphone is widely used because it has stable and consentaneous characteristics and is easy for being surface mounted on a circuit board. The transducer unit of this kind of microphone is usually manufactured from silicon through micro-electro-mechanical technology. It is a common knowledge that an integrated microphone must include a package in order to protect the inner transducer unit and some other electronic components.

The traditional silicon condenser microphone includes a microphone transducer unit, a readout circuit unit, a filter capacitance and an out shell accommodating the microphone transducer unit, the readout circuit unit for electrical signal output and the filter capacitance for EMI suppression. The out shell defines an acoustic aperture for allowing sound waves to reach the microphone transducer unit. A plurality of electrodes is provided for outputting signals. Such electrodes are adapted for being surface mounted on a user's circuit board as a result that the silicon condenser microphone can be electrically connected with outside components.

However, with fast development of such silicon condenser microphone, various surface mountable modes of the electrodes are required. For example, in some conditions, the silicon condenser microphone is required to be surface mounted from one side in which the acoustic aperture is defined. While in some other conditions, the silicon condenser microphone is required to be surface mounted from another side opposite to the acoustic aperture. The traditional silicon condenser microphone only has certain mounting surfaces and is suitable for a special condition while it can't meet both of the above-mentioned mounting conditions.

Hence, it is desired to have an improved package with selectively double side mountable electrodes solving the problems above.

BRIEF SUMMARY OF THE INVENTION

A surface mountable package includes a base and a cover with a cavity defined by the base and the cover. An acoustic transducer unit is attached to a surface formed on one of the base and the cover and residing within the cavity. One of the base and the cover defines an acoustic port facing the acoustic transducer unit for allowing sound waves to reach the acoustic transducer unit. A readout circuit unit and a filter capacitance are received in the cavity and are both electrical connected with the acoustic transducer by a plurality of circuit traces. The cover includes a first metal ring formed on an inner side thereof to enclose the acoustic transducer unit, the readout circuit unit and the filter capacitance. The base includes a corresponding second metal ring to press against the first metal ring in order to form a metal shielding area. A first metal connecting path is formed adjacent to the cavity and is electrically connected to the metal shielding area. A second metal connecting path is electrically connected to the acoustic transducer unit, the readout circuit unit and the filter capacitance. A pair of first surface mountable metal electrodes is attached to the base and the cover, respectively, in condition that the pair of first surface mountable metal electrodes are electrically connected to the first metal connecting path and cover opposite ends of the first metal connecting path. A pair of second surface mountable metal electrodes is attached to the base and the cover, respectively, in condition that the pair of second surface mountable metal electrodes are electrically connected to the second metal connecting path and cover opposite ends of the second metal connecting path. The surface mountable package is adapted for being selectively surface mounted to a circuit board via the first and the second surface mountable metal electrodes disposed on the base or the first and the second surface mountable metal electrodes disposed on the cover for different mounting conditions.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENT

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Figure 1:
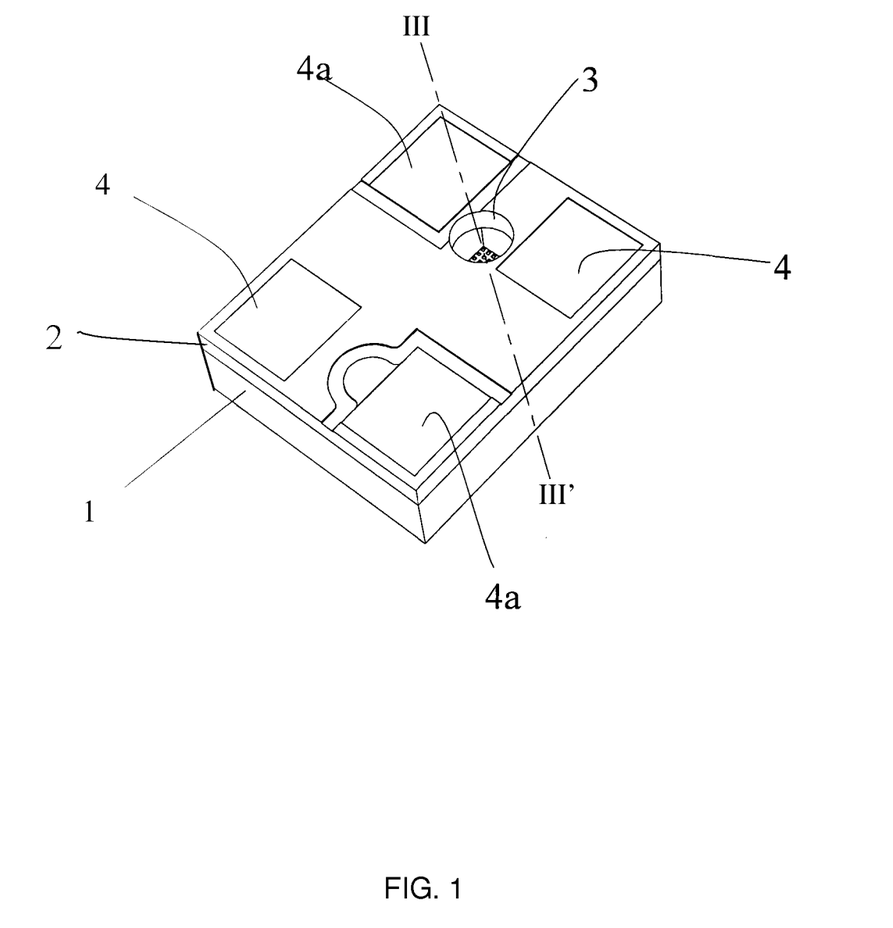
FIG. 1 is a perspective view of a surface mountable package for micro-electro-mechanical acoustic transducer according to a first embodiment of the present invention.
Figure 2:
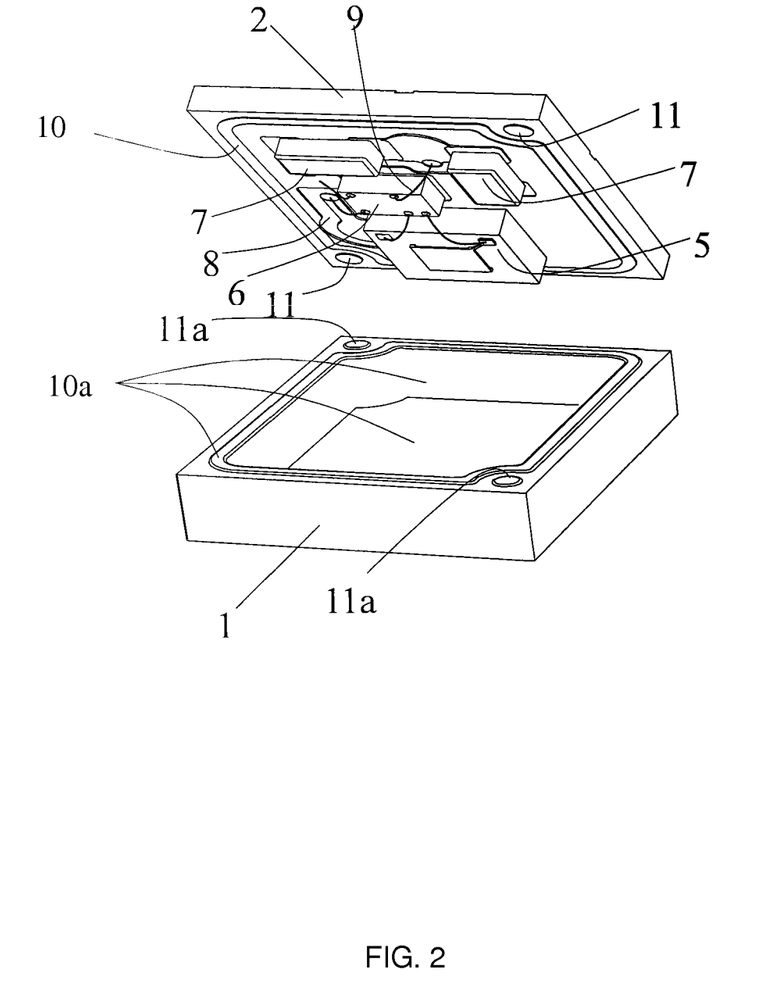
FIG. 2 is a part exploded perspective view of the surface mountable package showing a base and a cover thereof separated from each other.
Figure 3:
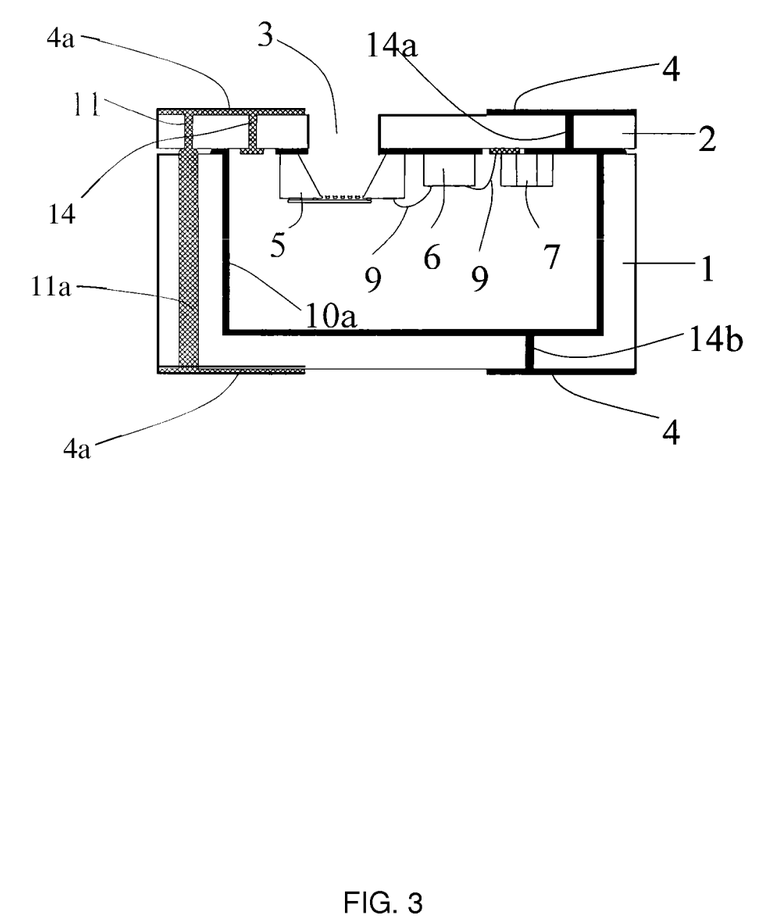
FIG. 3 is a schematic cross-sectional view of the surface mountable package taken along line III-III' of FIG. 1.

Now referring to FIGS. 1-9, four embodiments of present invention are illustrated, which will be detailed hereinafter. Referring to FIGS. 1 to 3, a double surface mountable package for a containing a micro-electro-mechanical acoustic transducer unit according to the first embodiment of the present invention defines an inner cavity formed by a base 1 and a cover 2. The cover 2 is electrically attachable to the base 1 for protection and processibility. The base 2 includes four side walls with the inner cavity formed therebetween and a bottom wall disposed at bottom of the cavity. The package includes a micro-electro-mechanical transducer unit 5, a readout circuit unit 6 and a filter capacitance 7 all surface mounted on an inner side of the cover 2 as shown in FIG. 2. The cover 2 defines an acoustic port 3 adapted for allowing sound waves to reach the transducer unit 5. However, in other embodiments, the acoustic port 3 can be formed in the base 1. A plurality of circuit traces 8 and pressure welding wires 9 are provided for electrically connection to all the transducer unit 5, the readout circuit unit 6 and the filter capacitance 7 in order to form a circuit. The inner side of the cover 2 further includes a first metal ring 10 enclosing the transducer unit 5, the readout circuit unit 6 and the filter capacitance 7. The first metal ring 10 is of central hollow while close shape. The base 1 includes a second metal ring 10a formed on another inner sides thereof corresponding to the first metal ring 10. The first and the second metal rings 10, 10a are attached to and overlap with each other in order to form a metal shielding area for protecting the surrounded electronic elements from outside interferences.

A pair of first metal connecting paths are formed enclosing the cavity and are electrically connected to the metal shielding area. Each first metal connecting path includes a first connecting portion 14b formed in a bottom portion of the base 1 and a second connecting portion 14a formed in the cover 2. Besides, a pair of second metal connecting paths are formed at diagonal corners outside the cavity and are electrically connected the transducer unit 5, the readout circuit unit 6 and the filter capacitance 7. Each second metal connecting path includes a third connecting portion 11a formed through a side wall of the base 1 and a fourth connecting portion 11 formed in the cover 2. The second metal connecting path is located at an outside of the first metal ring 10 in order to pack multiple layers electrically connection with each other.

Please referring to FIG. 3, the package includes a plurality of metal electrodes located at each opposite peripheral sides of the first and the second metal connecting paths. The metal electrodes are adapted for being surface mounted on a user's circuit board (not shown) and are arranged covering opposite peripheral sides of the first and the second connecting paths. In detail, as shown in FIG. 3, the plurality of metal electrodes include a pair of first metal electrodes 4 formed on the base 1 and the cover 2, respectively, in condition that the first metal electrode 4 mounted on a bottom surface of the base 1 is attached to the out surface of the first connecting portion 14b, and the other first metal electrode 4 mounted on a top surface of the cover 2 is attached to the out surface of the second connecting portion 14a. Similarly, the plurality of metal electrodes include a pair of second metal electrodes 4a formed on the base 1 and the cover 2, respectively, in condition that the second metal electrode 4a mounted on the bottom surface of the base 1 is attached to the out surface of the third connecting portion 11a, and the other second metal electrode 4a mounted on the top surface of the cover 2 is attached to the out surface of the fourth connecting portion 11. The first and the second metal electrodes 4, 4a also act as soldering pads for being mounted on the user's circuit board in assembly. In the first embodiment, the first metal electrodes 4 function as grounding electrodes and the second metal electrodes 4a function as output signal electrodes.

Besides, the transducer unit 5, the readout circuit unit 6 and the filter capacitance 7 come into a circuit with the circuit traces 8 of the cover via wire bonding method or SMT. The output signals transmit in turn via a metal connecting portion 14 formed in the cover 2, the second metal electrode 4a of the cover 2, the fourth connecting portion 11 and the third connecting portion 11a, and finally reach the second electrode 4a of the base 1. Under this condition, the second metal electrodes 4a of the base 1 and the cover 2 not only can function as multi electrical connecting medias but also can function as the soldering pads for being surface mounted to the user's circuit board. As a result, the package can be selectively double surface mountable to the use's circuit board via the metal electrodes 4, 4a of the base 1 or the metal electrodes 4, 4a of the cover 2 for suitable for different mounting conditions. The base 1 and the cover 2 are mainly formed by non-conductive materials such as FR-4, plastic or BT etc. The first and the metal connecting paths as well as the metal electrodes 4, 4a and other conductive members are embedded or attached to the base 1 and the cover 2.

Figure 4:
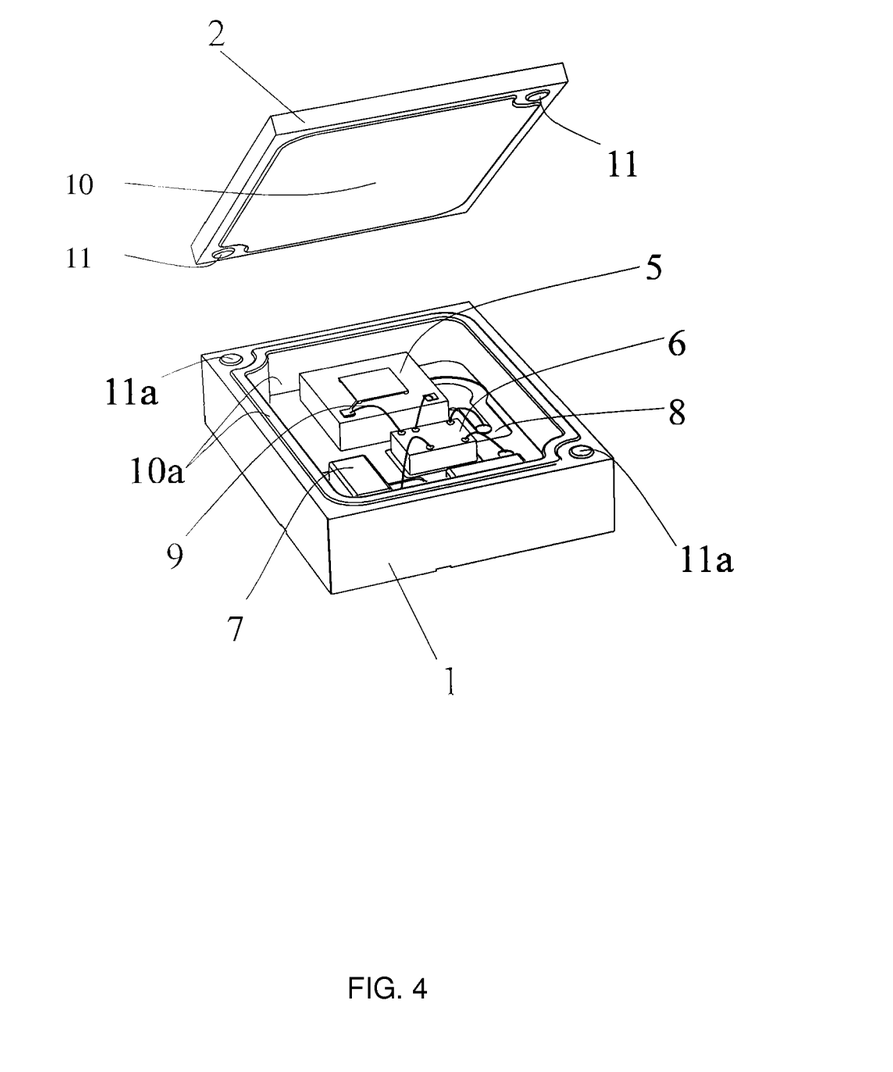
FIG. 4 is a part exploded perspective view of the surface mountable package according to a second embodiment of the present invention.
Figure 5:
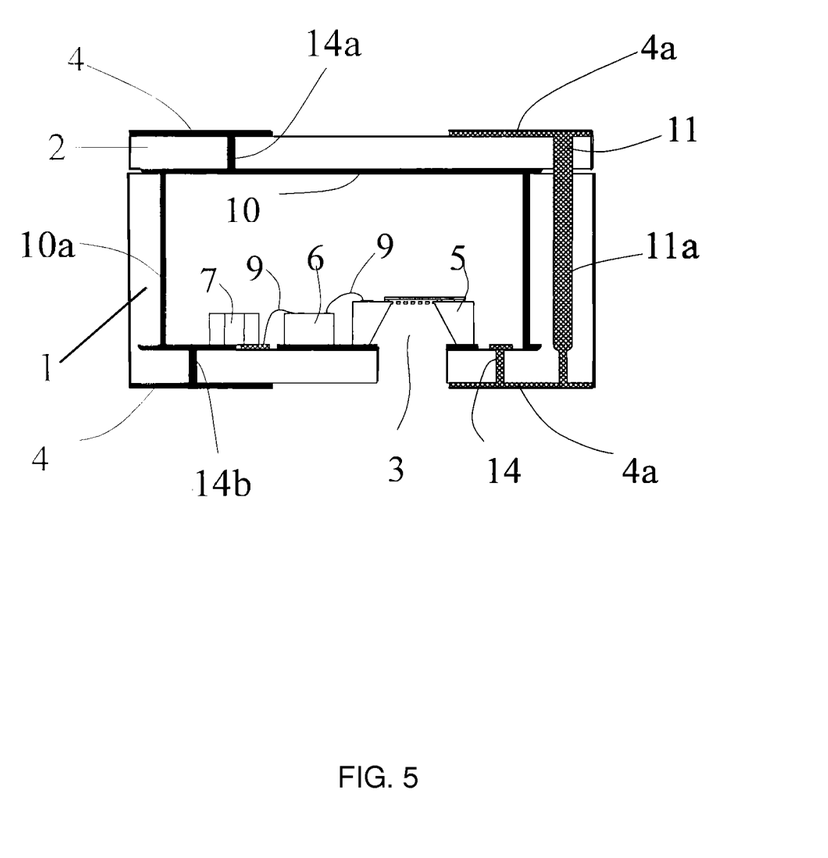
FIG. 5 is a schematic cross-sectional view of the surface mountable package shown in FIG. 4.

FIGS. 4 and 5 shows a second embodiment of the present invention similar to the first embodiment. The differences between them are that the transducer unit 5, the readout circuit unit 6 and the filter capacitance 7 are fixed to an inner and bottom side of the base 1. The pressure welding wires 9 provided for electrically connecting the transducer unit 5, the readout circuit unit 6 and the filter capacitance 7 are disposed on the base 1, accordingly. Besides, the first metal ring 10 is of unitary panel and solid configuration which is different from the central hollow shape first metal ring 10 of the first embodiment.

Please referring to FIGS. 4 and 5, the first metal ring 10 is plated on inner side wall of the cover 2 and is adapted for pressing against the second metal ring 10a of the base 1 in order to form an electronic shielding area. A pair of third connecting portions 11a are received in the side walls of the base 1 and are electrically connected with the fourth connecting portions 11 in order to pack multiple layers electrically connecting with each other. Besides, the transducer unit 5 directly faces the acoustic port 3 in order to receive sound waves from outside. The cover 2 is electrically fixed to the base 1 cooperate with the transducer unit 5 to form a hermetic acoustic chamber. The second metal ring 10a of the base 1 presses against the first metal ring 10 of the cover 2 and form an electronic shielding area for EMI suppression. The electronic shielding area is finally electrical connection to ground via the first connecting portion 14b of the base 1, the second connecting portion 14a of the cover 2, and then the first metal electrodes 4. The third and the fourth connecting portions 11a, 11 press against and are electrical connection with each other.

Besides, the transducer unit 5, the readout circuit unit 6 and the filter capacitance 7 come into a circuit with the circuit traces 8 of the base 1 through wire bonding method or SMT. The output signals transmit in turn via the metal connecting portion 14 formed in the base 1, the second metal electrode 4a of the base 1, the third and the fourth connecting portions 11a, 11, and finally reach the second electrode 4a of the cover 2.

Under this condition, the second metal electrodes 4a of the base 1 and the cover 2 not only can function as multi electrical connecting medias but also can function as surface mountable electrodes. As a result, the package can be selectively double surface mountable to the use's circuit board via the metal electrodes 4, 4a of the base 1 or the metal electrodes 4, 4a of the cover 2 for flexible mounting.

Figure 6:
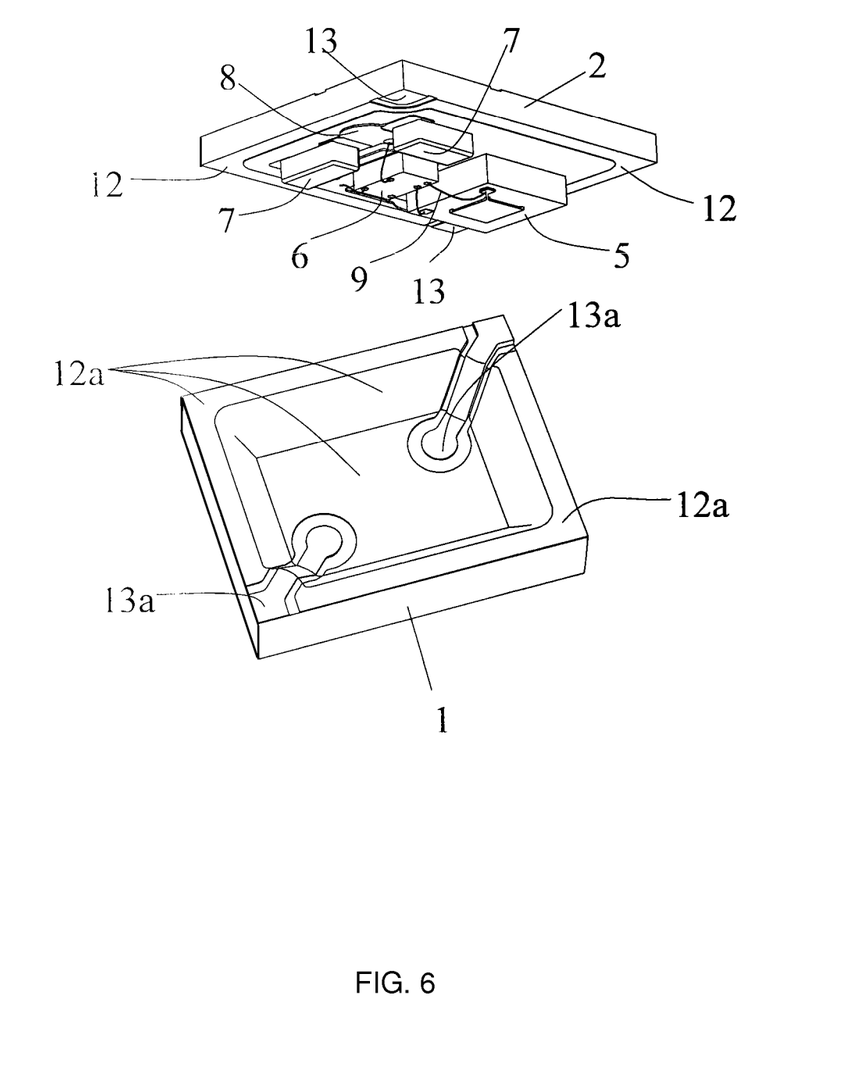
FIG. 6 is a part exploded perspective view of the surface mountable package according to a third embodiment of the present invention.
Figure 7:
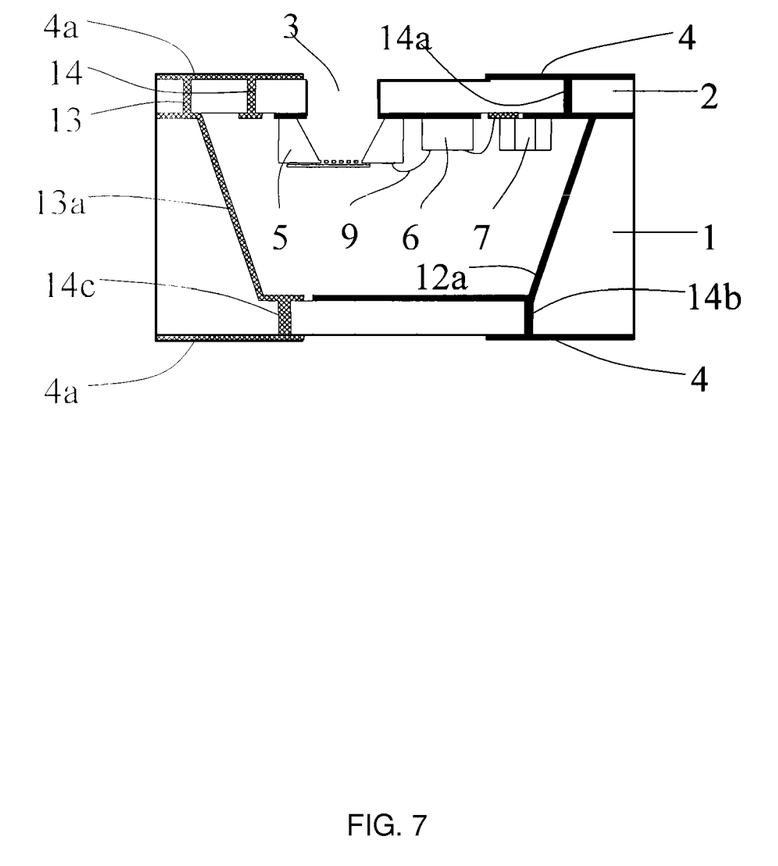
FIG. 7 is a schematic cross-sectional view of the surface mountable package shown in FIG. 6.

FIGS. 6 and 7 disclose a third embodiment of the present invention which is similar to the first embodiment. As disclosed in such embodiment, the transducer unit 5, the readout circuit unit 6 and the filter capacitance 7 are fixed to the inner and lower side of the cover 2. The cover 2 includes a plurality of circuit traces 8 electrically connected with each other. The base 1 includes a plurality of pressure welding wires 9 provided for electrically connecting the transducer unit 5, the readout circuit unit 6, the filter capacitance 7 and the circuit traces 8. The base 1 includes four side walls with the cavity enclosed therebetween and a bottom wall at bottom of the cavity. In such embodiment, all the side walls have inclined surfaces as a result that the cavity has an upper large opening and a lower contracted opening as best shown in FIG. 7. The second metal ring 12a is plated on the inclined and top surfaces of the side walls and are adapted for pressing against the first metal ring 12 of the cover 2 in order to form an electronic shielding area. Accordingly, the second metal ring 12a configures an upper large opening directly facing the cover 1 and a lower contracted opening.

The first metal connecting path includes the first connecting portion 14b formed in the base 1, the second metal ring 12a attached to the inclined surfaces of the side walls, and the second connecting portion 14a formed at the diagonal corners of the cover 2. The second metal ring 12a attached to the inclined surfaces of the side walls is electrically connected with the first connecting portion 14b. As shown in FIG. 6, the second metal connecting path includes first and second connecting areas 13a, 14c formed at the inclined surfaces and the inner bottom surface of the base 1, respectively. The second metal connecting path further includes a third connecting portion 13 at corners of the cover and adapted for electrically connecting with the first and the second connecting areas 13a, 14c. Since the side walls of the base 1 are slant and not parallel to the vertical plane, each side wall forms an angle with respect to the vertical plane for easy separating the first connecting area 13a and the second metal ring 12a through methods of light painting, exposure or Etching. The second metal ring 12a plated on the top surface of the side walls of the base 1 presses against the first metal ring 12 of the cover 2 and form an electronic shielding area for EMI suppression. The electronic shielding area is finally electrical connection to ground via the second connecting portion 14a of the cover 2, the first connecting portion 14b of the base 1, and then the first metal electrodes 4.

Besides, the transducer unit 5, the readout circuit unit 6 and the filter capacitance 7 come into a circuit with the circuit traces 8 through wire bonding method or SMT. The output signals transmit in turn via the metal connecting portion 14 formed in the cover 2, the second out metal electrode 4a of the cover 2, the third connecting portion 13, the first and the second connecting areas 13a, 14c, and finally reach the second out electrode 4a of the base 1. Under this condition, the second metal electrodes 4a of the base 1 and the cover 2 not only can function as multi electrical connecting medias but also can function as surface mountable electrodes. As a result, the package can be selectively double surface mountable to the user's circuit board via the metal electrodes 4, 4a of the base 1 or the metal electrodes 4, 4a of the cover 2 for flexible mounting.

Figure 8:
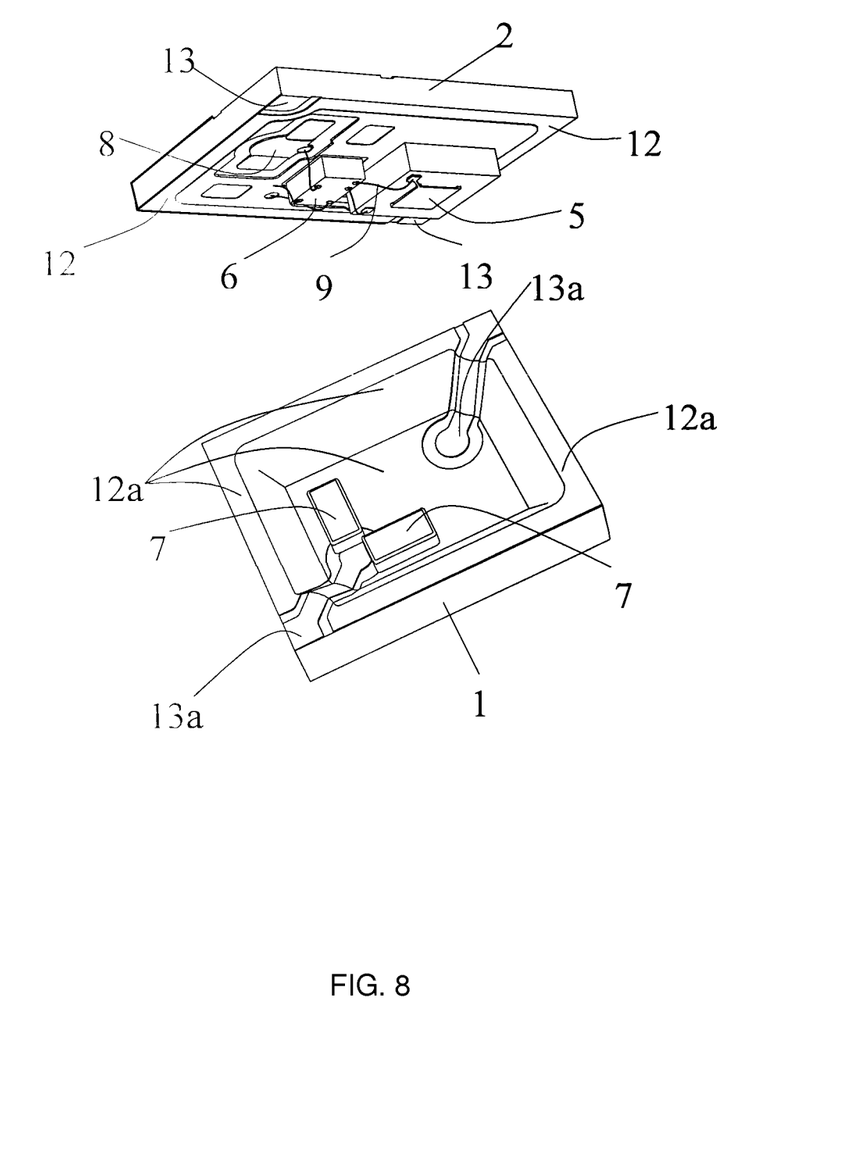
FIG. 8 is a part exploded perspective view of the surface mountable package according to a fourth embodiment of the present invention.
Figure 9:
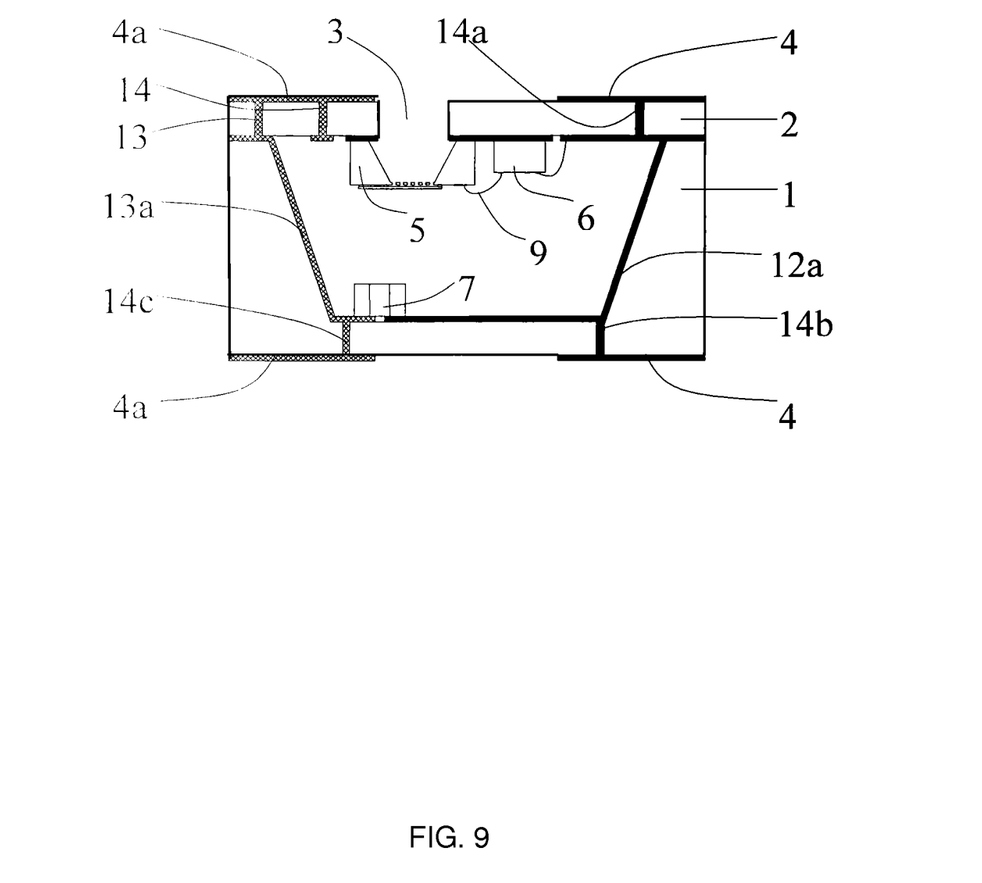
FIG. 9 is a schematic cross-sectional view of the surface mountable package shown in FIG. 8.

FIGS. 8 and 9 disclose a fourth preferred embodiment of the present invention similar to the third embodiment. The differences between them are that the filter capacitance 7 is electrically fixed to the inner and bottom surface of the base 1 and electrically and mechanically connected with the grounding metal electrode 4 and the output metal electrode 4a. Besides, the filter capacitance 7 straddles between the grounding metal electrode 4 and the output metal electrode 4a for filtrating output signals in order to enhance the performance of the package for micro-electro-mechanical acoustic transducer.

As described in the embodiments of the present invention, the base 1 and the cover 2 of the package for micro-electro-mechanical acoustic transducer come into electrically contact with each other via the first and the second metal connecting paths, so that the output signals can transmit outside through the metal electrodes 4, 4a mounted on peripheral surfaces of the base 1 or the cover 2. As a result, the package of the present invention can be selectively double surface mountable to the user's circuit board via the metal electrodes 4, 4a of the base 1 or the metal electrodes 4, 4a of the cover 2 for flexible mounting. Besides, the electronic elements such as the transducer unit 5, the readout circuit unit 6 or the filter capacitance 7 can be selectively fixed on inner sides of the base 1 and/or the cover 2 according to special arrangements in order to minimize package area and at much lower cost. Further more, the cavity formed by the base 1 and the cover 2 connects with the transducer unit 5 to cooperatedly form a hermetic acoustic cavity for improving acoustic characteristics thereof because the volume of the hermetic acoustic cavity is much similar to that of the package. Further more, comparing with the traditional package structures which set back acoustic cavities acting as the acoustic cavities, the package of the present invention is not mainly rely on the thickness of the transducer unit 5, so that the thickness of the transducer unit 5 as well as the hole thickness of the package can be reduced.

While specific embodiments have been illustrated and described, numerous modifications come to mind without significantly departing from the spirit of the invention, and the scope of protection is only limited by the scope of the accompanying claims.

We claim:

1. A surface mountable package comprising:
   a base and a cover with a cavity defined by the base and the cover;
   an acoustic transducer unit being attached to a surface formed on one of the base and the cover, the acoustic transducer unit residing within the cavity, one of the base and the cover defining an acoustic port facing the acoustic transducer unit for allowing sound waves to reach the acoustic transducer unit;
   a readout circuit unit and a filter capacitance both received in the cavity and both electrical connection with the acoustic transducer by a plurality of circuit traces;
   the cover comprising a first metal ring formed on an inner side thereof to enclose the acoustic transducer unit, the readout circuit unit and the filter capacitance;
   the base comprising a corresponding second metal ring to press against the first metal ring in order to form a metal shielding area;
   a first metal connecting path formed adjacent to the cavity and being electrically connected to the metal shielding area;
   a second metal connecting path being electrically connected to the acoustic transducer unit, the readout circuit unit and the filter capacitance;

a pair of first surface mountable metal electrodes attached to the base and the cover, respectively, in condition that the pair of first surface mountable metal electrodes are electrically connected to the first metal connecting path and cover opposite ends of the first metal connecting path; and a pair of second surface mountable metal electrodes attached to the base and the cover, respectively, in condition that the pair of second surface mountable metal electrodes are electrically connected to the second metal connecting path and cover opposite ends of the second metal connecting path.

2. The surface mountable package as claimed in claim 1, wherein the surface mountable package is adapted for being selectively surface mounted to a circuit board via the first and the second surface mountable metal electrodes disposed on the base or the first and the second surface mountable metal electrodes disposed on the cover.

3. The surface mountable package as claimed in claim 2, wherein the cover comprises a top surface with the corresponding first and the second mountable metal electrodes mounted thereon in condition that the corresponding first and the second mountable metal electrodes are upwardly exposed to outside.

4. The surface mountable package as claimed in claim 2, wherein the base comprises a bottom surface with the corresponding first and the second mountable metal electrodes mounted thereon in condition that the corresponding first and the second mountable metal electrodes are downwardly exposed to outside.

5. The surface mountable package as claimed in claim 1, wherein the cavity connects with the acoustic transducer unit to cooperatedly form a hermetic acoustic cavity.

6. The surface mountable package as claimed in claim 1, wherein the acoustic transducer unit, the readout circuit unit and the filter capacitance are all located on the inner side of the cover.

7. The surface mountable package as claimed in claim 6, wherein the first metal ring is closed and a center portion of the first metal ring is hollow to enclose the acoustic transducer unit, the readout circuit unit and the filter capacitance.

8. The surface mountable package as claimed in claim 1, wherein the first metal connecting path comprises a first connecting portion formed in a bottom wall of the base and a second connecting portion formed in the cover, opposite ends of the first connecting portion being electrically and mechanically connected to the first surface mountable metal electrode which is mounted on the cover and the first metal ring, respectively, and similarly, opposite ends of the second connecting portion being electrically and mechanically connected to the other first surface mountable metal electrode which is mounted on the base and the second metal ring, respectively.

9. The surface mountable package as claimed in claim 1, wherein the second metal connecting path comprises a third connecting portion embedded in a side wall of the base and a fourth connecting portion formed in the cover, the third and fourth connecting portions being electrically and mechanically connected with each other, and the third and fourth connecting portions further being electrically and mechanically connected to the pair of second surface mountable metal electrodes, respectively.

10. The surface mountable package as claimed in claim 9, wherein the fourth connecting portion is located at an outside of the first metal ring.

11. The surface mountable package as claimed in claim 9, further comprising a metal connecting portion embedded in the cover in condition that one end of the metal connecting portion is electrically and mechanically connected to the second surface mountable metal electrode which is mounted on the cover, and the other end of the metal connecting portion is exposed to the cavity.

12. The surface mountable package as claimed in claim 1, wherein the acoustic transducer unit and the readout circuit unit are both located on the inner side of the cover while the filter capacitance is located at a bottom wall of the base under a condition that the filter capacitance is straddled between and is electrically connected to the first and the second surface mountable metal electrodes, the first and the second surface mountable metal electrodes acting as grounding electrodes and output signal electrodes, respectively.

13. A surface mountable package comprising:

a base defining a cavity;

a cover attached to the base to cover the cavity;

an acoustic transducer unit being mounted within the cavity, one of the base and the cover defining an acoustic port facing the acoustic transducer unit for allowing sound waves to reach the acoustic transducer unit;

the cover comprising a first solid metal panel plated on an inner side thereof to shield the cavity;

the base comprising a corresponding second metal ring surrounding the cavity and pressing against the first solid metal panel to form a metal shielding area;

a grounding path being electrically connected to the metal shielding area;

an output signal transmission path being electrically connected to the acoustic transducer unit;

a pair of first surface mountable metal electrodes attached to the base and the cover, respectively, in condition that the pair of first surface mountable metal electrodes are electrically connected to the grounding path and cover opposite ends of the grounding path; and a pair of second surface mountable metal electrodes attached to the base and the cover, respectively, in condition that the pair of second surface mountable metal electrodes are electrically connected to the output signal transmission path and cover opposite ends of the output signal transmission path; wherein the surface mountable package is adapted for being selectively surface mounted to a circuit board via the first and the second surface mountable metal electrodes disposed on the base or the first and the second surface mountable metal electrodes disposed on the cover.

14. The surface mountable package as claimed in claim 13, wherein the cover comprises a top surface with the corresponding first and the second mountable metal electrodes mounted thereon in condition that the corresponding first and the second mountable metal electrodes are upwardly exposed to outside, and wherein the base comprises a bottom surface with the corresponding first and the second mountable metal electrodes mounted thereon in condition that the corresponding first and the second mountable metal electrodes are downwardly exposed to outside.

15. The surface mountable package as claimed in claim 13, wherein the grounding path comprises a first connecting portion formed in a bottom wall of the base and a second connecting portion formed in the cover, opposite ends of the first connecting portion being electrically and mechanically connected to the first surface mountable metal electrode which is mounted on the base and the second metal ring, respectively, and similarly, opposite ends of the second connecting portion being electrically and mechanically connected to the other first surface mountable metal electrode which is mounted on the cover and the first solid metal panel, respectively.

16. The surface mountable package as claimed in claim 13, wherein the output signal transmission path comprises a third connecting portion embedded in a side wall of the base and a fourth connecting portion formed in the cover, the third and fourth connecting portions being electrically and mechanically connected with each other, and the third and fourth connecting portions further being electrically and mechanically connected to the pair of second surface mountable metal electrodes, respectively, and wherein the surface mountable package further comprises a metal connecting portion embedded in a bottom wall of the base in condition that one end of the metal connecting portion is electrically and mechanically connected to the second surface mountable metal electrode which is mounted on the base, and the other end of the metal connecting portion is exposed to the cavity.

17. A surface mountable package comprising:
- a base comprising a plurality of side walls with a cavity enclosed thereby, at least one side wall defining an inclined inner surface communicating with the cavity in order that the cavity has an upper large opening and a lower contracted opening;
- a cover attached to the base to cover the cavity;
- an acoustic transducer unit being attached to an inner surface of the cover, one of the base and the cover defining an acoustic port facing the acoustic transducer unit for allowing sound waves to reach the acoustic transducer unit;
- the cover comprising a first metal ring formed on the inner surface thereof to enclose the acoustic transducer unit;
- the base comprising a corresponding second metal ring attached to the inclined inner surface, the second metal ring pressing against the first metal ring in order to form a metal shielding area;
- a first metal connecting path being electrically connected to the metal shielding area;
- a second metal connecting path being electrically connected to the acoustic transducer unit;
- a pair of first surface mountable metal electrodes attached to the base and the cover, respectively, in condition that the pair of first surface mountable metal electrodes are electrically connected to the first metal connecting path and cover opposite ends of the first metal connecting path; and
- a pair of second surface mountable metal electrodes attached to the base and the cover, respectively, in condition that the pair of second surface mountable metal electrodes are electrically connected to the second metal connecting path and cover opposite ends of the second metal connecting path; wherein
- the surface mountable package is adapted for being selectively surface mounted to a circuit board via the first and the second surface mountable metal electrodes disposed on the base or the first and the second surface mountable metal electrodes disposed on the cover.

18. The surface mountable package as claimed in claim 17, wherein the first metal connecting path comprises a first connecting portion formed in a bottom wall of the base and a second connecting portion formed in the cover, opposite ends of the first connecting portion being electrically and mechanically connected to the first surface mountable metal electrode which is mounted on the cover and the first metal ring, respectively, and similarly, opposite ends of the second connecting portion being electrically and mechanically connected to the other first surface mountable metal electrode which is mounted on the base and the second metal ring, respectively.

19. The surface mountable package as claimed in claim 17, wherein the first and the second surface mountable metal electrodes function as grounding electrodes and output signal electrodes, respectively.

20. The surface mountable package as claimed in claim 17, wherein the second metal ring is manufactured via method of light painting or exposure or Etching.

\* \* \* \* \*